US012782479B2

(12) United States Patent
Varney

(10) Patent No.: US 12,782,479 B2
(45) Date of Patent: Nov. 3, 2026

(54) SUPERCONDUCTING MAGNET SYSTEM FOR GENERATING HOMOGENEOUS MAGNETIC FIELD

(71) Applicant: Oxford Nanoscience Limited, Abingdon (GB)

(72) Inventor: Andrew Varney, Abingdon (GB)

(73) Assignee: Oxford Nanoscience Limited, Abingdon (GB)

( * ) Notice: Subject to any disclaimer, the term of this patent is extended or adjusted under 35 U.S.C. 154(b) by 160 days.

(21) Appl. No.: 18/575,087

(22) PCT Filed: Jun. 1, 2022

(86) PCT No.: PCT/GB2022/051396
§ 371 (c)(1),
(2) Date: Dec. 28, 2023

(87) PCT Pub. No.: WO2023/275505
PCT Pub. Date: Jan. 5, 2023

(65) Prior Publication Data

US 2024/0345190 A1 Oct. 17, 2024

(30) Foreign Application Priority Data

Jun. 30, 2021 (GB) ...................................... 2109449

(51) Int. Cl.
*G01R 33/38* (2006.01)
*G01R 33/34* (2006.01)
(Continued)

(52) U.S. Cl.
CPC ..... *G01R 33/3815* (2013.01); *G01R 33/3403* (2013.01); *G01R 33/34053* (2013.01); *G01R 33/3875* (2013.01)

(58) Field of Classification Search
CPC ............ G01R 33/3815; G01R 33/3875; G01R 33/34053; G01R 33/3403; G01R 33/00;
(Continued)

(56) References Cited

U.S. PATENT DOCUMENTS 4,180,769 A * 12/1979 Gang ................. G01R 33/3815 505/879
6,265,960 B1 * 7/2001 Schauwecker ....... G01R 33/421 324/320
(Continued)

FOREIGN PATENT DOCUMENTS

JP 20004-273568 A 9/2004
JP 4293341 B2 * 7/2009 ............. A61B 5/055
JP 2018181960 A 11/2018

OTHER PUBLICATIONS

Hahn, Seung-Yong, Nonlinear Behavior of a Shim Coil in an LTS/HTS NMR Magnet With an HTS Insert Comprising Double-Pancake HTS-Tape Coils, IEEE Transactions on Applied Superconductivity, IEEE, USA, vol. 19, No. 3, Jun. 1, 2009, pp. 2285-2288, XP011263649, ISSN: 1051-8223, abstract; section I; figure 1.
(Continued)

*Primary Examiner* — Lee E Rodak
*Assistant Examiner* — Taqi R Nasir
(74) *Attorney, Agent, or Firm* — BLANK ROME LLP

(57) ABSTRACT

A magnet system is provided for generating a homogeneous magnetic field in a target region that finds benefit in the field of nuclear magnetic resonance (NMR), particularly NMR spectroscopy. The magnet system comprises a first magnet having a first solenoid formed from superconductor material and a set of one or more pairs of compensation coils, each said pair being disposed coaxially with the first solenoid and symmetrically positioned with an axial offset about the geometrical centre point so as to define an annular volume within the bore between the set of compensation coils. A first
(Continued)

pair of compensation coils in the set is connected in electrical series with the first solenoid. A shim system is disposed within the annular volume and comprising one or more superconducting shim coils. The magnetic field in the target region has a homogeneity of less than 10 parts per million, wherein the target region is a 1 cm diameter spherical volume centred on the centre point.

20 Claims, 2 Drawing Sheets

(51) Int. Cl.
*G01R 33/3815* (2006.01)
*G01R 33/3875* (2006.01)

(58) Field of Classification Search
CPC ............ G01R 33/0035; G01R 33/0023; G01R 33/0017; G01R 31/3191; G01B 7/004; G01C 17/38; H01L 39/223
See application file for complete search history.

(56) References Cited

U.S. PATENT DOCUMENTS

| | | | | |
|---|---|---|---|---|
| 2015/0340140 | A1* | 11/2015 | Yoshida | H01F 6/00 505/211 |
| 2016/0322144 | A1 | 11/2016 | Hollis et al. | |
| 2017/0089992 | A1* | 3/2017 | Sakakibara | H01F 6/008 |
| 2024/0345190 | A1 | 10/2024 | Varney | |

OTHER PUBLICATIONS

International Search Report, mail date Aug. 30, 2022, received in corresponding PCT patent application No. PCT/GB2022/051396.
GB Examination Report received in corresponding patent application No. GB2109449.5, mail date Jun. 27, 2025.
EP Examination Report received in corresponding patent application No. EP22731286.5, mail date Apr. 7, 2026.
Machine translation of Japanese patent No. JP2004273568 (A), published Sep. 30, 2004.
Chinese Office Action issued in application No. 202280467187 mailed Apr. 11, 2026.
Chinese Office Action (machine translation of written opinion) issued in application No. 202280467187 mailed Apr. 11, 2026.

* cited by examiner

SUPERCONDUCTING MAGNET SYSTEM FOR GENERATING HOMOGENEOUS MAGNETIC FIELD

CROSS-REFERENCE TO RELATED APPLICATIONS

This application is a national stage filing of PCT Application No. PCT/GB/2022/051396, filed on Jun. 1, 2022, which claims the benefit of GB Application No. 2109449.5, filed Jun. 30, 2021, both of which are hereby incorporated by reference in their entirety.

FIELD OF THE INVENTION

The invention relates to a magnet system for generating a highly homogeneous magnetic field. Accordingly, the invention finds benefit in the field of nuclear magnetic resonance (NMR), particularly NMR spectroscopy.

BACKGROUND

It is desirable to obtain a highly homogeneous magnetic field in various NMR modalities, such as magnetic resonance imaging, but especially in NMR spectroscopy. NMR spectroscopy enables chemical information about samples such as their molecular structure to be measured. The NMR measurement process involves the generation of a high strength, uniform magnetic field within a working volume containing a target region. The sample is positioned in the target region and then subjected to RF irradiation causing the spins of certain nuclei to precess. On removing the RF irradiation, the spins return to their rest state and their precession frequency can be monitored thus giving an indication of structural information and the like. A highly homogeneous magnetic field is required within the target region to obtain accurate measurements of the chemical structure. The homogeneity within a target region is typically measured by considering changes in the z-component of a magnetic field (which is the primary field direction) within a spherical target region with respect to the field at the centre of that region. A magnetic field having a homogeneity of less than 10 ppm in the target region has a Bz component varying by less than 10 parts per million at any position within the target region (i.e. the difference between the maximum field within the target region and the minimum field within the target region is less than 10 ppm of the field value at the origin of that region). Homogeneity can be stated in positive or negative values, although it is the absolute value that is relevant.

The magnet system for an NMR device typically comprises a superconducting magnet held at cryogenic temperatures (below 100 kelvin) in use. The superconducting magnet is typically formed as a solenoid defining a bore with a central axis along which the target region for positioning the sample is arranged. An infinitely long solenoid would produce a perfectly homogeneous magnetic field in the target region, however such solenoids cannot be manufactured in practice so compensation coils may be wound about the central axis for correcting any end effects from the solenoid to improve the magnetic field homogeneity at the target region. Compensation coils (also sometimes referred to in the art as "Garrett coils") are wired in series with the magnet and may take the form of solenoids or pancake coils. Compensation coils are arranged to correct for any inhomogeneity in the magnetic field arising from the design of the magnet, including the end effects from the solenoid. Shim coils, which are active shims, typically provide a lower level of field correction and may be operated to correct for inhomogeneity resulting from the actual build of the NMR device or background effects.

Typically room temperature (RT) shims and/or passive shims have been used in a demountable configuration within an externally accessible bore. Superconducting shims can carry much higher electrical currents than RT shims and so are suitable for producing stronger magnetic fields. However, superconducting shims are conventionally mounted around the outside of the superconducting magnet because the region inside the superconducting magnet is reserved for other components, such as a second superconducting magnet and RT components, which contribute towards the magnetic field strength and homogeneity in the target region. An empty working volume must also be preserved within the bore of the magnet for moving a sample into and out from the target region. However, shimming solutions provided on the outside of the main magnet have a relatively limited effect on the magnetic field in the target region because the effect of spatial variations in current density on the uniformity of the magnetic field scales strongly with distance.

Internal compensation coils are typically arranged outside of the superconducting magnet. However one exception is the 4.2K 800/63 magnet from Oxford Instruments. FIG. 1 is a schematic illustration showing half of a cross-section through a cylindrical coil set according to this prior art magnet assembly. The cross-section is taken along the central axis 20', which extends along the bore of the magnet. The assembly is only shown for one side of the central axis 20' for clarity, although it will be appreciated that the coils are symmetrically arranged on the opposite side of the central axis 20'. The assembly has a superconducting magnet 10' comprising a first solenoid 2', second solenoid 4' and third solenoid 5', each formed from niobium-tin ($Nb_3Sn$), wherein the first solenoid 2' is the innermost solenoid and the second solenoid 4' is arranged between the first solenoid 2' and the third solenoid 5'. The magnet 10' further comprises a fourth solenoid 6', fifth solenoid 7' and sixth solenoid 8', each formed from niobium-titanium (NbTi). Each solenoid 2'-8' of the magnet 10' is co-axially wound about the central axis 20'. $Nb_3Sn$ is generally more expensive than NbTi, however it remains superconducting up to a magnetic flux density of 30 T, compared to a limit of roughly 15 T for NbTi. $Nb_3Sn$ sections are therefore usually arranged radially closer to the bore of the magnet, where the field is higher, with NbTi being used further from the centre where they can remain superconducting. The 800/63 magnet is relatively unusual in that it has compensation coils arranged within the superconducting magnet. In particular, an annular former 3', occupying a similar amount of axial space to a solenoid, is arranged between the first and second solenoids 2', 4' and supports two pairs of compensation coils that are electrically connected in series to the magnet 10'. The first pair of compensation coils is formed from a first coil **3*a*' and a second coil 3*b*', and the second of pair compensation coils is formed from a third coil 3*c*' and a fourth coil 3*d*'. The compensation coils 3*a*'-3*d*' are coaxially wound around the central axis 20' and symmetrically positioned with an axial offset about a geometrical centre point along the central axis 20' marked with an 'X'. The coils forming the first pair 3*a*', 3*b*' are larger and are axially displaced further from the centre point than the coils forming the second pair 3*c*', 3*d*'**.

It is desirable to provide new arrangements for obtaining a highly homogeneous magnetic field at the target region, in particular arrangements that can lead to a reduction in the size of the assembly and/or electrical power consumption. The invention is set in the context of solving these problems.

SUMMARY OF THE INVENTION

A first aspect of the invention is a magnet system for generating a homogeneous magnetic field in a target region, the magnet system comprising:

- a first magnet having a first solenoid formed from superconductor material wound so as to define a bore and a central axis, wherein the geometrical centre of the first solenoid defines a centre point on the central axis;
- a set of one or more pairs of compensation coils, each pair of compensation coils being disposed coaxially upon the central axis and symmetrically positioned with an axial offset about the geometrical centre point so as to define an annular volume within the bore between the set of compensation coils, wherein a first pair of compensation coils in the set is connected in electrical series with the first solenoid; and
- a shim system disposed within the annular volume and comprising one or more superconducting shim coils, the shim system operable when in use to shim the magnetic field in the target region;
- wherein the system is arranged when in use such that the magnetic field in the target region has a homogeneity of less than 10 parts per million (ppm), wherein the target region is a 1 cm diameter spherical volume (dsv) centred on the centre point.

The magnet system uses a combination of compensation coils and a shim system disposed inside the first magnet to achieve a high level of magnetic field homogeneity in the target region. The shim system is arranged within a central annular region of the magnet (both axially and radially) that is conventionally occupied by solenoids or compensation coils. The one or more superconducting shim coils are positioned closer to the central axis than is typically the case for prior art systems, and so the magnetic field produced by the shim system is much stronger at the target region. Stronger adjustable shim solutions can therefore be applied to correct for inhomogeneity at the target region. Further shim coils could be provided around the outside of the first magnet. However, the inclusion of the centrally-located shim system facilitates a reduction in the overall size of the assembly and the electrical power consumption because larger shim coils that may otherwise be arranged around the outside of the first magnet can then be omitted. This is particularly relevant for magnet systems producing a field in a 1 cm dsv target region having a homogeneity of less than 10 ppm.

With reference to the prior art system illustrated by FIG. 1, we have realised that the effects of the third and fourth compensation coils 3*c*', 3*d*' in homogenising the magnetic field at the target region can be recreated by numerous different possible adjustments to the magnet system that can be made elsewhere. Moreover, these compensation coils occupy valuable axial space within which a superconducting shim system can be provided to better improve the homogeneity at the target region.

Returning to the first aspect of the invention, a first pair of compensation coils in the set is connected in electrical series with the first solenoid. The first pair is therefore provided for correcting a magnetic field inhomogeneity at the target region arising from the design of the first magnet. The first pair of compensation coils is typically disposed at a radial position from the central axis which is less than that of the first solenoid. The first solenoid and the first pair of compensation coils are preferably formed from low-temperature superconductor material, preferably still niobium-tin. Niobium-tin is particularly desirable because of its ability to remain superconducting in a high magnetic flux density. The compensation coils can hence be used in a high-field region of the magnet system.

The magnet system preferably further comprises a second magnet having one or more solenoids formed from superconductor material and arranged coaxially with the first magnet such that the solenoids of the first and second magnets have a common geometrical centre point on the central axis, wherein the second magnet is located within the bore such that the annular volume is positioned between the first and second magnets. The shim system may therefore be arranged radially between the first and second magnets. Providing a second magnet system enables the selection of different materials or currents to adjust the magnetic field strength and/or homogeneity at the target region.

A second pair of compensation coils in the set of one or more pairs of compensation coils is typically connected in electrical series with the second magnet. This second set of compensation coils may therefore correct for inhomogeneity arising from the design of the second magnet. The second pair of compensation coils is also preferably disposed at a radial position which is greater than that of the second magnet. However typically the second pair of compensation coils is disposed at a radial position which is smaller than that of the first pair of compensation coils. For example, each compensation coil of the second pair of compensation coils may be arranged along a plane normal to the central axis and extending through the second magnet and a corresponding compensation coil from the first pair of compensation coils, wherein said compensation coil of the second pair is arranged between the second magnet and the corresponding coil from the first pair of compensation coils. More generally, however, the compensation coils in one of the first and second pairs is preferably radially adjacent to the compensation coils in the other of the first and second pairs, so as to define opposing axial ends of the annular volume. This arrangement produces desirable levels of high magnetic field homogeneity in the target region.

The magnet system is particularly suitable for magnets using a combination of high-temperature superconductor (HTS) and low-temperature superconductor (LTS) materials. The second pair of compensation coils and/or the second magnet is preferably formed from HTS material, such as bismuth strontium calcium copper oxide (BSCCO, e.g. BSCCO 2212 or BSCCO 2223) or rare-earth barium copper oxide REBCO. HTS materials have a higher critical field in comparison with LTS materials and so the incorporation of HTS material in the second magnet enables higher magnetic fields to be produced at the target region. This is because, in order to provide a usable magnet system capable of producing a field strength above about 23.5 T for example, with current technology, HTS material is needed. However, since this is orders of magnitude more expensive than the LTS materials, magnet systems are typically a hybrid, with the first 15 T to 20 T provided by LTS windings. The term "HTS material" is intended to mean superconducting materials that show nominally usable superconducting properties beyond 30 T and even 40 T (and typically at temperatures above about 4.2 kelvin, such as at 8 kelvin, 20 kelvin, 77 kelvin or 90 kelvin). By the term "LTS material" we intend to mean superconducting materials that have a maximum field strength up to about 22 T at 4.2 kelvin at an engineering critical current density of 100 amperes per square millimetre (A/mm$^2$). This includes materials such as NbTi and $Nb_3Sn$.

Some enhancement in performance can be provided for LTS materials by operating them below 4.2 kelvin. However, this only raises the maximum field strength limit by about 2 to 2.5 T. The engineering critical current density of $Nb_3Sn$ drops abruptly at field strengths above about 20 T making this material less efficient above 20 T and effectively unusable above about 23.5 T at 4.2K.

Although HTS material remains superconducting at higher temperatures than LTS material, it is typically most convenient to hold the first and second magnets at a common temperature in use. The first and second magnets are therefore preferably contained within the same cryogenic vessel, such as a Dewar, configured to cool the first and second magnets to a common temperature in use. Typically the cryogenic vessel is filled with liquid helium to cool the first and second magnets to approximately 4 kelvin in use. However, a cryogen-free refrigerator such as pulse tube refrigerator can alternatively be used to cool the first and/or second magnets.

The first magnet preferably comprises a plurality of solenoids formed from superconductor material wound about the central axis and outside of the bore, wherein each said solenoid is disposed at a respective radial position. Each said solenoid of the first magnet is preferably formed from LTS material. An outermost solenoid of the first magnet is preferably formed from niobium-titanium. Niobium-titanium is less brittle than niobium-tin and HTS materials, and significantly cheaper, so is desirable in the lower-field region of the magnet system that is radially further from the central axis.

Each compensation coil of the second pair of compensation coils preferably comprises a pancake coil. Pancake coils are known in the art and arise wherein the conductor is wound in a spiral outwards about an origin and along a common plane. In the present case the origin is positioned along the central axis of the magnet system and the plane is normal to the central axis. Two pancake coils may be stacked along the axial direction of the magnet to form a "double-pancake". This occurs where the coil is wound with a conductor that spirals in from the outside of one pancake coil to the innermost position of a second pancake coil from which the conductor is then wound radially outwards, the second pancake being coaxially arranged with the first pancake. If further pancake coils are wound on to the same stack, each coil is connected to adjacent coils in the same manner either at a radially innermost position or at a radially outermost position depending on where the end of the spiral is located for the pancake coil from which it is continuing. It has been found that, by arranging each compensation coil of the second pair of compensation coils as one or more pancake coils (for example to form a pancake stack), this provides a method for producing a compensated solenoid, for example using superconducting tape conductor with a layer-wound solenoid. This is particularly relevant for arrangements having a second magnet located within the bore such that the annular volume is positioned between the first and second magnets, the second magnet formed from layer-wound HTS material and wherein the second pair of compensation coils are also formed from HTS material.

The shim system is preferably connected to a different electrical circuit from the set of one or more solenoids and pairs of compensation coils. Preferably still, the shim system is formed from LTS material, preferably niobium-tin. The shim system may also be centred on a plane extending through the centre point in a direction perpendicular to the central axis. Typically, the first magnet, the set of one or more compensation coils and the shim system (and the second magnet, where provided) are arranged such that said plane forms a plane of symmetry.

This arrangement produces a magnetic field at the target region having a high homogeneity.

It is particularly desirable to ensure there are no electrical circuits or support members extending through the annular volume, for example between each said pair of compensation coils. For example, in the instance that the compensation coils are formed from a brittle substance such as $Nb_3Sn$ or a HTS, any electrical circuit extending between the compensation coils within the annular region without adequate support is liable to break or the performance may degrade. The existence of any such cables or support material within the annular volume may also interfere with the function of the shim system that is disposed in the annular volume. The magnet system is typically arranged so that each said compensation coil has an inner axial end forming an edge of the annular volume and an outer axial end opposite to the inner axial end. Each said compensation coil is preferably mounted inside the first magnet to a support member provided at the outer axial end of the compensation coil. End-mounting the compensation coils as such prevents the need to run cables or supports within the annular region. The magnet system is also preferably arranged so that an electrical current flows into and out from each said compensation coil from the outer axial end of the compensation coil. Therefore, for each said pair of compensation coils, a first compensation coil of the pair is preferably not electrically connected to or physically mounted to the second compensation coil of the pair within the annular volume.

The magnet system herein described is particularly suitable at high fields and is preferably arranged to produce a magnetic field in the target region in excess of 20 tesla, preferably in excess of 25 tesla. MRI systems typically use larger samples and so it is generally more relevant to achieve homogeneity over a larger target region in these systems. Consequently, having an extremely high degree of homogeneity over a 1 cm dsv target region is generally not relevant to MRI systems. The magnet system is therefore particularly suitable for use in NMR spectroscopy and preferably produces a homogeneity in the target region below 5 ppm, preferably still below 1 ppm. A second aspect of the invention is therefore an NMR spectrometer comprising a magnet system according to the first aspect. The NMR spectrometer may further comprise a cryogenic cooling system configured to cool the magnet system to below 100 kelvin, preferably below 10 kelvin, during operation of the NMR spectrometer. The magnet system is also suitable for use in other applications, such as Fourier Transform Mass Spectrometry, FTMS (also referred to as Fourier-Transform Ion Cyclotron resonance, FT-ICR).

BRIEF DESCRIPTION OF THE DRAWINGS

Embodiments of the invention will now be discussed with reference to the accompanying drawings, in which.

DETAILED DESCRIPTION

Figure 2:
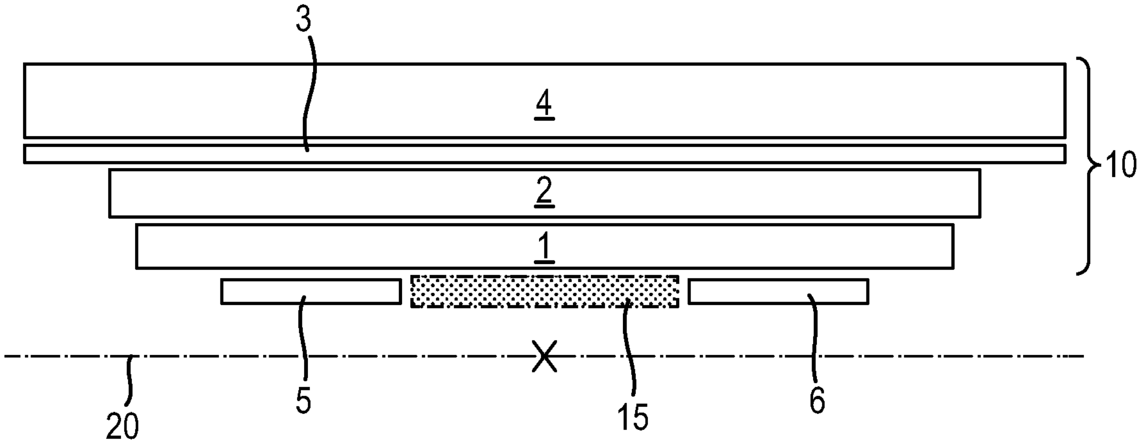
FIG. 2 is a schematic cross-sectional illustration through part of a magnet system according to a first embodiment.

FIG. 2 is a schematic illustration showing half of a cross-section through a magnet system according to a first embodiment. The cross-section is taken along a central axis 20 and only one side of the system is shown in FIG. 2 for clarity, although it will be appreciated that the apparatus shown are symmetrically arranged on the opposite side of the central axis 20. A magnet 10 is provided comprising a first solenoid 1 and a second solenoid 2, each formed from $Nb_3Sn$. The magnet 10 further comprises a third solenoid 3 and fourth solenoid 4, each formed from NbTi. Each said solenoid of the magnet 10 is coaxially wound about a central axis 20. The first solenoid 1 is the innermost solenoid of the assembly arranged closest to the central axis 20, with each remaining solenoid disposed at respective radial positions from the central axis 20. The second solenoid 2 is arranged between the first solenoid 1 and the third solenoid 3, and the third solenoid 3 is arranged between the second solenoid 2 and the fourth solenoid 4. The central axis 20 defines a bore for the magnet system within which a sample can be moved in use and positioned at a centre point marked 'X' defining a geometrical centre for the magnet 10. There exists a target region in the form of a 1 cm diameter spherical volume centred at the centre point within which the system is configured to produce a magnetic field orientated along the central axis 20 (Bz) that varies within that region by less than 10 parts per million of the Bz field value at the centre point. The solenoids 1-4 are symmetrically disposed about the central axis 20, centred at the centre point, with the third and fourth solenoids 3, 4 having a longer axial length than the first and second solenoids 1, 2.

A pair of $Nb_3Sn$ compensation coils 5, 6 is disposed coaxially upon the central axis 20 and electrically connected in series to the first, second, third and fourth solenoids 1-4. The pair of compensation coils 5, 6 is symmetrically positioned with an axial offset about the centre point to define an annular volume at a radial position which is less than that of the first solenoid 1. The compensation coils 5, 6 are particularly effective at cancelling field inhomogeneity in part due to their relatively central radial position in comparison with some prior art compensation coils that are arranged around the outside of the superconducting magnet. The annular volume extends between opposing inner axial ends of the first and second compensation coils 5, 6. A superconducting shim coil assembly 15 (also referred to herein as a "shim system") comprising one or more shim coils is arranged within the annular volume for shimming the magnetic field in the target region, this notably being located in close proximity to the geometrical centre "X".

Figure 1:
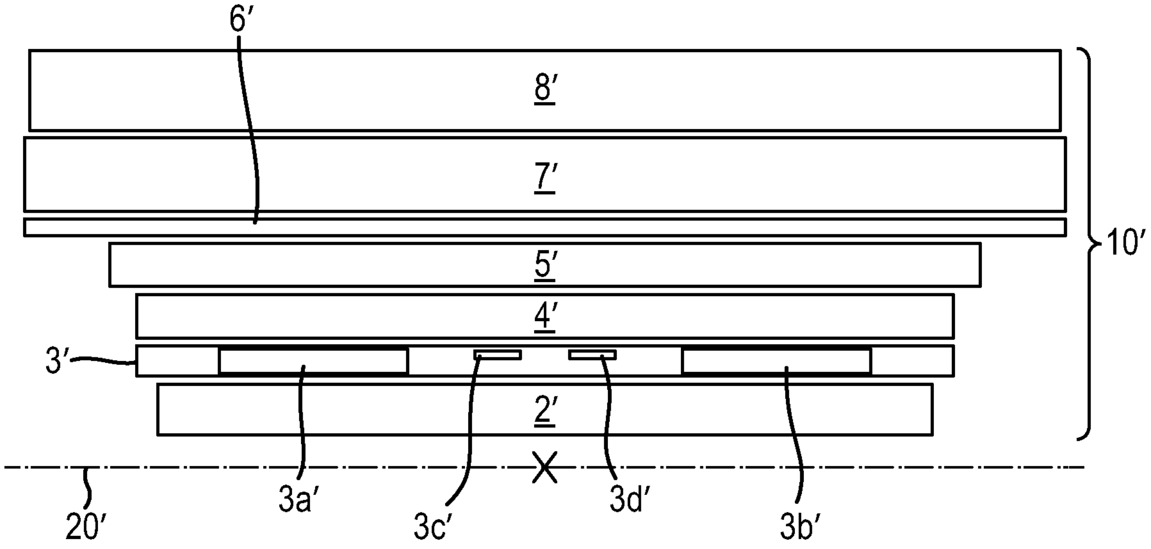
Fig. 1 PRIOR ART
FIG. 1 is a schematic cross-sectional illustration through part of a prior art magnet system.
Figure 3:
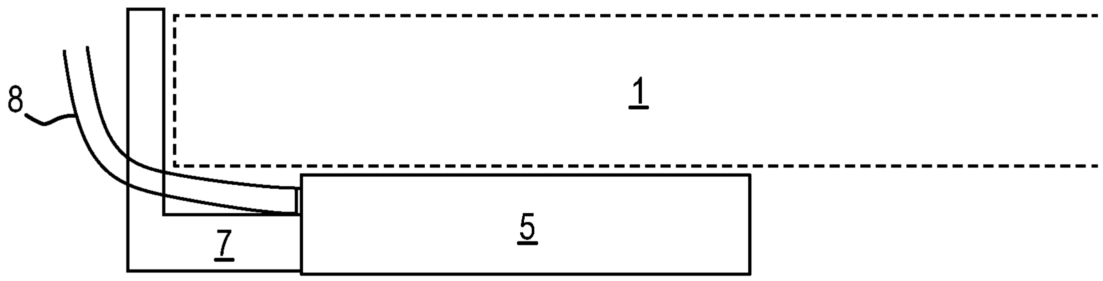
FIG. 3 is a schematic illustration of an end-mounted compensation coil forming part of the first embodiment.

In further contrast to the magnet system of the prior art earlier discussed with reference to FIG. 1, the first and second compensation coils 5, 6 are not supported by a former extending axially between the compensation coils 5, 6. It is particularly desirable that the annular volume between the pair of compensation coils 5, 6 is absent of any such supports for the pair of compensation coils 5, 6 or electrical circuitry connecting the compensation coils 5, 6. This is because such cabling would also need to be formed from the same superconducting material as the compensation coils. Due to the fragility of $Nb_3Sn$ in its reacted condition, there are significant limitations on the electromagnetic stress that can be managed without overstraining the $Nb_3Sn$ wire. If such cabling were to extend between the two compensation coils 5, 6 it could lead to locally less well supported stresses, and any joints will be fragile to manufacture and liable to degrade. These problems are exacerbated at the high-field axial position which the annular volume occupies. It is particularly desirable therefore that the compensation coils 5, 6 are each end-mounted from their respective outer axial ends. An example of such an end-mounting is illustrated by FIG. 3 in respect of the first compensation coil 5, in which certain features from FIG. 2 have been omitted for clarity. An outer axial end of the first compensation coil 5 is connected to a support 7 that extends axially outside of the first solenoid 1 to support the first compensation coil 5 from one axial end of the magnet system. Although not shown, a similar structure is provided to support the other compensation coil 6 from the opposite axial end. Coils 5 and 6 are typically linked electrically as a unit in the protection circuit (by connections located outside of the first magnet 10) to avoid issues such as axial forces generated with asymmetric protection in the case of a quench. The coil support structures could be bolted separately to end plates and/or together with bars or a central flange. Although such an additional structure would require some space in the central region, it would be less than needed to support the fragile cable which would otherwise run across this central region.

Electrical cabling 8 formed from $Nb_3Sn$ is connected to a joint formed on the outer axial end of the first compensation coil 5 for carrying a current into and out from the first compensation coil 5. Each said compensation coil 5, 6 is therefore constructed as a separate block that is axially mounted from each end of the magnet. The coils are wound as solenoids, terminated and jointed separately for each said compensation coil 5, 6. By avoiding running cabling directly between the two compensation coils 5, 6, unsupported lead runs can be avoided and more space is made available for the superconducting shim assembly 15. This in turn enables better correction for any magnetic field inhomogeneity at the target region. The compensation coils 5, 6 will still typically remain electrically connected to each other, albeit not by cabling extending through the annular volume.

Figure 4:
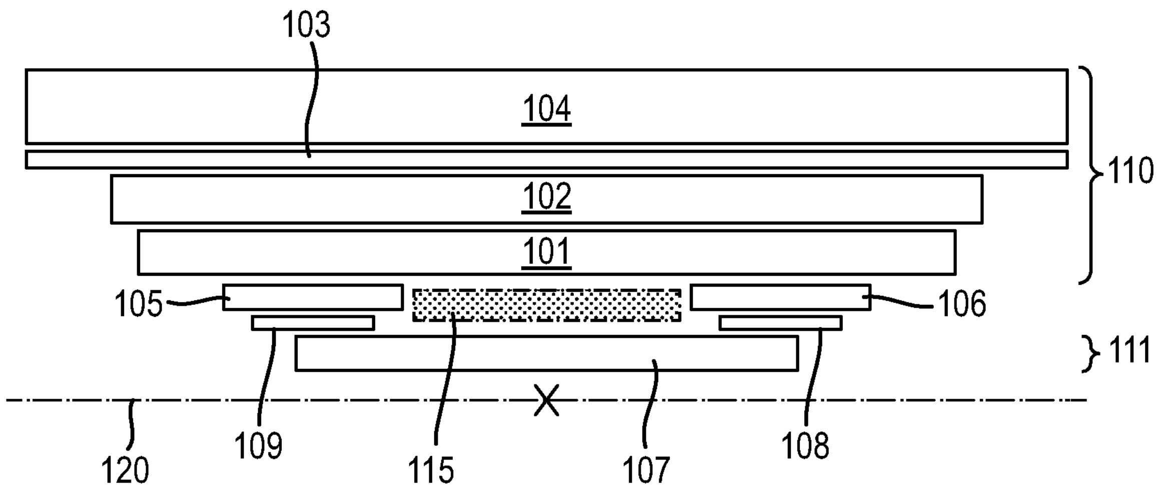
FIG. 4 is a schematic cross-sectional illustration through part of a magnet system according to a second embodiment.

FIG. 4 is a schematic illustration showing half of a cross-section through a magnet system according to a second embodiment, which forms part of a high-field NMR spectrometer. Although not shown, the entire arrangement shown by FIG. 4 is contained within a cryogenic vessel which is cooled to around 4 kelvin by liquid helium. Other features, such as additional shim coils that may further contribute towards the homogeneity of the magnetic field, or for ordinary operation of the spectrometer, are not shown but may be provided. A first magnet 110 is provided having the same configuration as the first magnet 10 in the first embodiment. A second magnet 111 is additionally provided comprising an inner solenoid 107 formed from a HTS material, in this case BSCCO 2212. The second magnet 111 may optionally comprise more than one HTS solenoids and is typically wound along a smaller axial length than the remaining magnets (as is the case here). The solenoids 101-104 of the first magnet 110 are connected to a first electrical circuit, and the inner solenoid 107 forming the second magnet 111 is connected to a second electrical circuit, so that the current can be independently adjusted for each said magnet 110, 111.

A shim system comprising a shim coil assembly 115 is arranged radially between the first solenoid 101 of the first magnet 110 and the inner solenoid 107 of the second magnet 111. In the second embodiment, the shim coil assembly 115 is formed from $Nb_3Sn$ however it may alternatively be formed from a HTS material. The shim system is centred along a plane normal to the central axis 120 extending through the geometrical centre point 'X' for the assembly, which forms a plane of symmetry for the assembly. The inner solenoid 107 is the innermost solenoid of the magnet assembly arranged closest to the central axis 120, with each remaining solenoid disposed at respective radial positions from the central axis 120, as described in relation to the first embodiment.

A set of two pairs of compensation coils 105, 106, 108, 109 is arranged axially either side of the shim coil assembly 115. The first pair of compensation coils 105, 106 is formed from $Nb_3Sn$ and connected in electrical series with the first magnet 101, as occurs for the first embodiment. However the second pair of compensation coils 108, 109 is formed from BSCCO 2212 and connected in electrical series with the second magnet 111. The first pair of compensation coils 105, 106 correct for field inhomogeneity that arises from the first magnet 110. Partly due to the expense of the HTS material (and for layer-winding the availability of longer lengths of material while avoiding the need for joints to be constructed within the windings themselves), HTS solenoid coils tend to be relatively short and also operate at high current density. Hence, if uncompensated, they generate a relatively large amount of inhomogeneity for their size. The second pair of compensation coils 108, 109 therefore correct for field inhomogeneity that arise from the second magnet 111. Each said compensation coil of the first and second pair is end-mounted, as discussed in connection with the first embodiment, and may take the form of either one or more pancake or solenoid coils. Typically, each coil in the first pair of compensation coils 105, 106 is wound as a solenoid. However, particularly in the case that the inner solenoid 107 is formed from layer-wound HTS tape material (e.g. BSCCO 2223), it is desirable that each coil of the second pair of compensation coils 108, 109 is wound as one or more pancake coils, for example in a stack. In this way, the layer-wound solenoid design produces the majority of the zeroth order magnetic field at the target region with better control over the inhomogeneity introduced than would be the case for a solenoid constructed solely from stacks of pancake coils. The pancake coils as compensation coils make a much smaller contribution to the zeroth order central field than the layer-wound solenoid, but approximately the same amount of higher order magnetic field terms (of reversed sign) in order to cancel any higher order inhomogeneity.

The incorporation of HTS material in the second embodiment enables higher magnetic field strengths to be generated at the target region located at the centre point. It is anticipated that field strengths in excess of 25 tesla can thereby be obtained at the target region. The use of internal compensation coils, particularly in embodiments using HTS material, together with the central shim system has the benefit that the field homogeneity at the target region is improved. Furthermore this is achieved without the need for large shim assemblies around the outside of the first magnet, thereby improving the efficiency of the arrangement.

It will therefore be appreciated that the magnet systems herein proposed, in particular the arrangement of the shim system with respect to the compensation coils and superconducting magnet(s), enables the use of stronger adjustable shimming solutions. This facilitates the generation of a highly homogeneous magnetic field at the target region for producing higher resolution, reliable NMR-generated data.

The invention claimed is:

1. A magnet system for generating a homogeneous magnetic field in a target region, the magnet system comprising:

a first magnet having a first solenoid formed from superconductor material wound so as to define a bore and a central axis, wherein a geometrical center of the first solenoid defines a center point on the central axis;

a set of one or more pairs of compensation coils, each pair of compensation coils being disposed coaxially upon the central axis and symmetrically positioned with an axial offset about the geometrical center point so as to define an annular volume within the bore between the set of compensation coils, wherein a first pair of compensation coils in the set is connected in electrical series with the first solenoid; and a shim system disposed within the annular volume and comprising one or more superconducting shim coils, the shim system operable when in use to shim the magnetic field in the target region, wherein the shim system is disposed between the compensation coils in the bore and is connected to a different electrical circuit from the set of one or more pairs of compensation coils and the first solenoid;

wherein the system is arranged when in use such that the magnetic field in the target region has a homogeneity of less than 10 parts per million, wherein the target region is a 1 cm diameter spherical volume centered on the center point.

2. The magnet system according to claim 1, wherein the first pair of compensation coils is disposed at a radial position which is less than that of the first solenoid.

3. The magnet system according to claim 1, wherein the first solenoid and the first pair of compensation coils are formed from low-temperature superconductor material, preferably niobium-tin.

4. The magnet system according to claim 1, further comprising a second magnet having one or more solenoids formed from superconductor material and arranged coaxially with the first magnet such that the solenoids of the first and second magnets have a common geometrical center point on the central axis, wherein the second magnet is located within the bore such that the annular volume is positioned between the first and second magnets.

5. The magnet system according to claim 4, wherein a second pair of compensation coils in the set is connected in electrical series with the second magnet.

6. The magnet system according to claim 5, wherein the second pair of compensation coils is disposed at a radial position which is greater than that of the second magnet.

7. The magnet system according to claim 6, wherein the first pair of compensation coils is disposed at a radial position which is less than that of the first solenoid, wherein the compensation coils in one of the first and second pairs is radially adjacent to the compensation coils in the other of the first and second pairs, so as to define opposing axial ends of the annular volume.

8. The magnet system according to claim 5, wherein the second pair of compensation coils and the second magnet are formed from high-temperature superconductor material, preferably BSCCO.

9. The magnet system according to claim 8, wherein each compensation coil of the second pair of compensation coils is arranged as a pancake coil.

10. The magnet system according to claim 4, wherein the first and second magnets are contained within a cryogenic vessel configured to cool the first and second magnets to a common temperature in use.

11. The magnet system according to claim 1, wherein the first magnet comprises a plurality of solenoids formed from superconductor material wound about the central axis and outside of the bore, wherein each said solenoid is disposed at respective radial position.

12. The magnet system according to claim 11, wherein each said solenoid of the first magnet is formed from low-temperature superconductor material, and wherein an outermost solenoid of the first magnet is formed from niobium-titanium.

13. The magnet system according to claim 1, wherein the shim system is formed from low-temperature superconductor material, preferably niobium-tin.

14. The magnet system according claim 1, wherein the shim system is centered on a plane extending through the center point in a direction perpendicular to the central axis.

15. The magnet system according to claim 14, wherein the first magnet, the set of one or more compensation coils and the shim system are arranged such that said plane forms a plane of symmetry.

16. The magnet system according to claim 1, wherein each said compensation coil has an inner axial end forming an edge of the annular volume and an outer axial end opposite to the inner axial end.

17. The magnet system according to claim 16, wherein each said compensation coil is mounted inside the first magnet to a support member provided at the outer axial end of the compensation coil.

18. The magnet system according to claim 16, wherein an electrical current flows into and out from each said compensation coil from the outer axial end of the compensation coil.

19. The magnet system according claim 16, wherein for each said pair of compensation coils, a first compensation coil of the pair is not electrically connected to or physically mounted to the second compensation coil of the pair within the annular volume.

20. An NMR spectrometer comprising the magnet system according claim 1.

* * * * *